US008054676B2

(12) United States Patent
Tanguay et al.

(10) Patent No.: US 8,054,676 B2
(45) Date of Patent: Nov. 8, 2011

(54) MEMORY SYSTEM SUCH AS A DUAL-INLINE MEMORY MODULE (DIMM) AND COMPUTER SYSTEM USING THE MEMORY SYSTEM

(75) Inventors: Kevin B. Tanguay, Thornton, CO (US); James R. Edwards, Longmont, CO (US); David W. Frodin, Longmont, CO (US); Marshall A. Dawson, Longmont, CO (US); Scott B. Hoot, Longmont, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 699 days.

(21) Appl. No.: 12/193,365

(22) Filed: Aug. 18, 2008

(65) Prior Publication Data

US 2010/0042778 A1 Feb. 18, 2010

(51) Int. Cl.
*G11C 11/24* (2006.01)
(52) U.S. Cl. .............. 365/149; 365/191; 365/233.13; 711/105
(58) Field of Classification Search .......... 365/149, 365/191, 233.13; 711/105, 115
See application file for complete search history.

(56) References Cited

U.S. PATENT DOCUMENTS

| | | | | |
|---|---|---|---|---|
| 6,173,382 B1 * | 1/2001 | Dell et al. | ...... | 711/170 |
| 6,507,888 B2 * | 1/2003 | Wu et al. | ...... | 711/105 |
| 6,707,756 B2 * | 3/2004 | Amidi | ...... | 365/189.2 |
| 6,711,646 B1 * | 3/2004 | Pelissier et al. | ...... | 710/305 |
| 6,771,526 B2 * | 8/2004 | LaBerge | ...... | 365/63 |
| 6,971,039 B2 * | 11/2005 | Krause et al. | ...... | 713/400 |
| 7,133,324 B2 * | 11/2006 | Park et al. | ...... | 365/185.05 |
| 7,161,865 B2 * | 1/2007 | Fujisawa | ...... | 365/226 |
| 7,221,617 B2 * | 5/2007 | Flach et al. | ...... | 365/189.011 |
| 7,327,612 B2 * | 2/2008 | Bacchus et al. | ...... | 365/189.011 |
| 7,739,441 B1 * | 6/2010 | Lee et al. | ...... | 710/315 |

OTHER PUBLICATIONS

AMD Geode™ LX Processors; Data Book; Publication ID: 33234F; May 2007; pp. 1, 2, 11-20, and 209-236 (pp. 1-40).
AMD Geode™ CS5536; Companion Device Data Book; Publication ID: 33238G; May 2007; pp. 1, 2, and 13-22 (pp. 1-12).
JEDEC Standard No. 21-C, Reference Design Specification; PC2700 DDR SDRAM Unbuffered SO—DIMM; Revision 1.0; Release 11; pp. 4.20.6-1 to 4.20.6-26.
JEDEC Standard No. 21-C, Appendix X: Serial Presence Detect (SPD) for Fully Buffered DIMM; Revision 1.1; Release 16A; pp. 4.1.2.7-1 to 4.1.2.7-47.
JEDEC Standard No. JESD79; Double Data Rate (DDR) SDRAM Specification; Standard No. 79-2; JEDEC Solid State Technology Association; May 2002; pp. 1-75.
JEDEC Standard No. JESD79-2C; DDR2 SDRAM Specification; Revision of JESD79-2B; JEDEC Solid State Technology Association; May 2006; pp. 1-108.

* cited by examiner

*Primary Examiner* — Alexander Sofocleous

(57) ABSTRACT

A memory system (250) includes a plurality of memory devices (260) adapted to be coupled to an interface (140), an indicator (272) for indicating a type of the plurality of memory devices (260), and an override circuit (280) having a first terminal adapted to be coupled to the interface (140), a second terminal coupled to the plurality of the memory devices (260), and a control input for receiving a control signal. The override circuit (280) is responsive to the control signal to alter an operation of the memory system (250).

20 Claims, 5 Drawing Sheets

500

510

|  | BANK ADDR | DDR1 ADDRESS (MODE) | | | | | | | | | | | | | |
|---|---|---|---|---|---|---|---|---|---|---|---|---|---|---|
|  |  | 13 | 12 | 11 | 10 | 9 | 8 | 7 | 6 | 5 | 4 | 3 | 2 | 1 | 0 |
| MR | 0 | 0 | 0 | 0 | 0 | 0 | DR | TM | CAS LAT | | | BT | BL | | |
| EMR | 1 | 0 | 0 | 0 | 0 | 0 | 0 | 0 | 0 | 0 | FC | 0 | 0 | DS | DL |
|  | 10 | RESERVED | | | | | | | | | | | | | |
|  | 11 | RESERVED | | | | | | | | | | | | | |

520

|  | BANK ADDR | DDR2 ADDRESS (MODE) | | | | | | | | | | | | | |
|---|---|---|---|---|---|---|---|---|---|---|---|---|---|---|
|  |  | 13 | 12 | 11 | 10 | 9 | 8 | 7 | 6 | 5 | 4 | 3 | 2 | 1 | 0 |
| MR | 0 | 0 | PD | WR | | | DR | TM | CAS LAT | | | BT | BL | | |
| EMR | 1 | 0 | EN | RS | S# | OCD | | | Rt | AL | | | Rt | DS | DL |
| EMR2 | 10 | 0 | 0 | 0 | 0 | 0 | 0 | HT | 0 | 0 | 0 | 0 | 0 | 0 | 0 |
| EMR3 | 11 | UNUSED (0000h) | | | | | | | | | | | | | |

FIG. 5

MEMORY SYSTEM SUCH AS A DUAL-INLINE MEMORY MODULE (DIMM) AND COMPUTER SYSTEM USING THE MEMORY SYSTEM

FIELD OF THE DISCLOSURE

The invention relates generally to memory systems, and more particularly to interface circuits for memory systems.

BACKGROUND

A typical data processing system, such as a computer, microcomputer, embedded microcontroller, or other computational device, includes a central processing unit (CPU), a peripheral device interface, and a memory device. The memory device stores instructions, which are executed by the data processing system to perform a desired task. The data processing system stores and retrieves information at the memory device using an appropriate memory interface device and memory interface protocol. The memory interface protocol is often promulgated as an industry standard.

Standards are often developed and ratified by industry representatives to facilitate interoperability of device components provided by multiple manufactures. Industry standards are prevalent in the electronics industry, and cover most aspects of technology, including memory interfaces. Memory device standards can define electrical, operational, and physical attributes of a memory device so that manufacturers of individual components of a data processing system can ensure operability with memory devices provided by different memory device manufacturers.

The Joint Electron Devices Engineering Council (JEDEC) Solid State Technology Association is the semiconductor engineering standardization body of the Electronic Industries Alliance (EIA). JEDEC has set forth a memory device standard referred to as double data rate (DDR) synchronous dynamic random access memory (SDRAM) that is currently especially popular. The original DDR JEDEC standardization specification was published in the year 2000. The original DDR standard (referred to here as DDR1) was very successful and subsequent variations of the DDR standard have been adopted by industry, such as DDR2 and DDR3, which describe memory devices with increased access bandwidth and operating frequency. However, memory devices that comply with one memory standard typically cannot be substituted for devices compliant to a different memory standard.

New memory standards are revised and introduced with such regularity that the longevity of a particular standard can be relatively short. Memory suppliers are quick to transfer development and manufacturing resources to reflect a revised standard. As a result, manufacturers of equipment that interface to memory devices must regularly re-design their products to operate with memory devices that comply with the newest standard, or else stockpile inventory of memory devices that can otherwise become unavailable or prohibitively expensive.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items, and in which:

FIG. 5 illustrates in a tabular format JEDEC standard mode register definitions for DDR1 and DDR2 memory devices.

DETAILED DESCRIPTION

Figure 1:
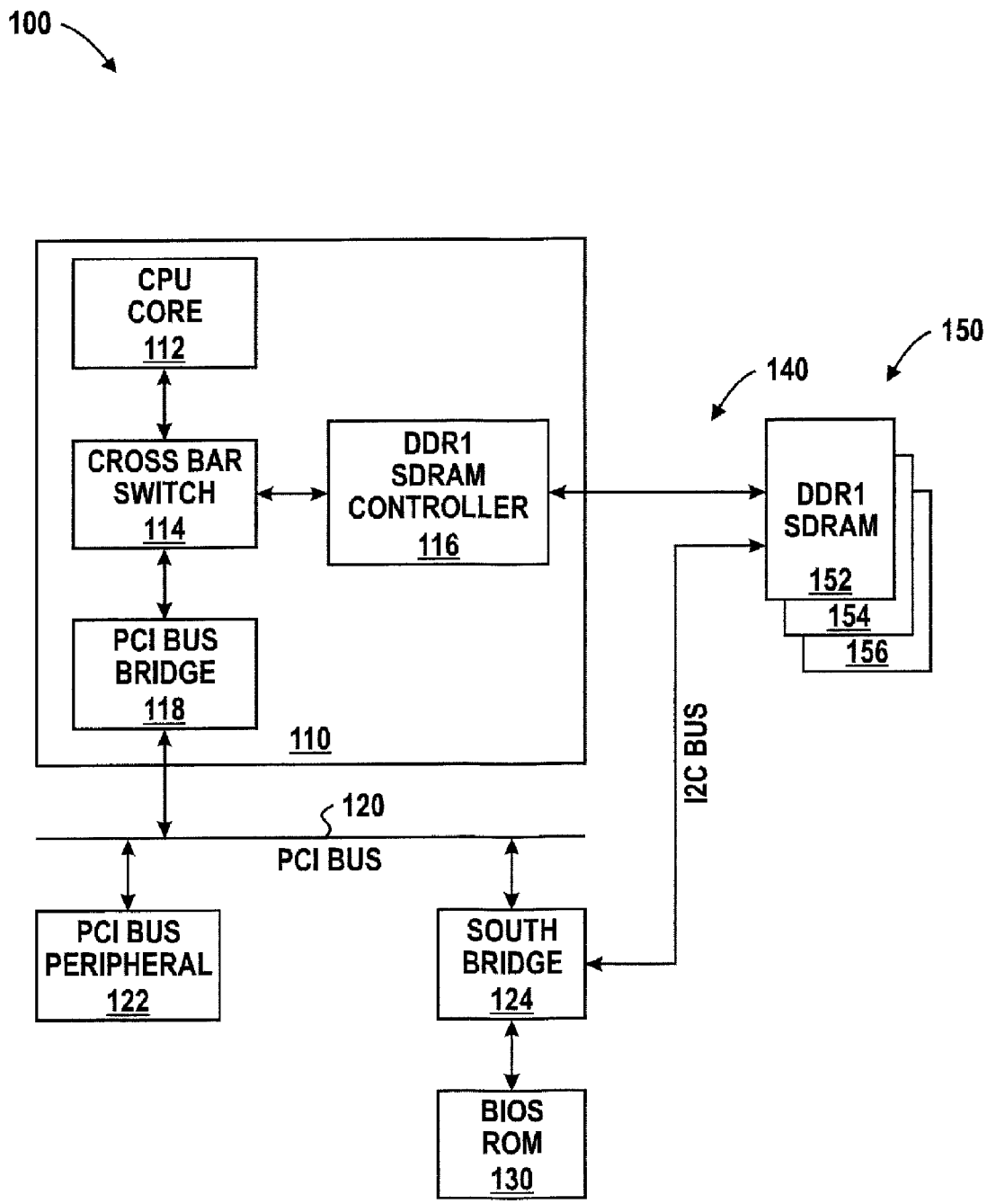
FIG. 1 illustrates in block diagram form a data processing system known in the prior art.

FIG. 1 illustrates in block diagram form a data processing system 100 known in the prior art. Data processing system 100 generally includes a microprocessor 110, a peripheral component interconnect (PCI) bus 120, labeled "PCI BUS," a PCI bus peripheral 122, a south bridge 124, a basic input/output system (BIOS) read only memory (ROM) 130, a memory interface 140, and a dual inline memory module (DIMM) 150. Microprocessor 110 includes a CPU core 112, a crossbar switch 114, a PCI bus bridge 118, and a DDR1 synchronous dynamic random access memory (SDRAM) controller 116. DIMM 150 includes DDR1 SDRAMs 152, 154, and 156.

Cross bar switch 114 has a first bidirectional interface to CPU core 112, a second bidirectional interface to PCI bus bridge 118, and a third bidirectional interface to DDR1 SDRAM controller 116. PCI bus bridge 118 has a second bidirectional interface to PCI bus 120, connected to PCI bus peripheral 122 and to south bridge 124. South bridge 124 has a second bidirectional interface to BIOS ROM 130, and a third bidirectional interface, an Inter-Integrated circuit (I2C) interface labeled "I2C BUS," to DIMM 150. DDR1 SDRAM controller 116 has a second bidirectional interface 140 to DIMM 150.

CPU core 112 exchanges information with PCI bus peripheral 122 by configuring crossbar switch 114 to support communication to PCI bus bridge 118. PCI bus bridge 118 translates accesses from the internal bus protocol of microprocessor 110 into a PCI standard bus protocol of PCI bus 120. CPU core 112 accesses information stored in BIOS ROM 130 by issuing a read request and addressing BIOS ROM 130. PCI bridge 118 transmits the request to south bridge 124, and south bridge 124 performs the requested memory access of BIOS ROM 130. BIOS ROM 130 provides the requested information and the information is communicated back to CPU 112 via PCI bus 120 and the internal interfaces at microprocessor 110. South bridge 124 is a particular PCI bus peripheral device that can provide additional functionality that may not be present at microprocessor 110, such as a hard disk drive interface, a universal synchronous bus (USB) interface, an audio codec, and interfaces to other general input/output (IO) devices.

CPU core 112 exchanges information with memory device 150 via DDR1 SDRAM controller 116. DDR1 SDRAM controller 116 provides an electrical and functional interface to DIMM 150 using signals and protocols commensurate with the JEDEC DDR1 standard. A DIMM, such as DIMM 150, is available in a physically smaller package variation known as a small outline dual in-line memory module (SO-DIMM), and thus provides an advantage for use in compact electronic device products. Microprocessor 110 accesses a serial presence detect (SPD) device at DIMM 150 via the I2C bus that interfaces south bridge 124 to DIMM 150. I2C is a multi-master serial computer interface.

When power or a reset signal is applied to data processing system 100, microprocessor 110 begins accessing instructions stored at BIOS ROM 130. Microprocessor 110 must initialize DIMM 150 as specified by the JEDEC DDR standard before microprocessor 110 can access DIMM 150. A portion of the instructions stored at BIOS ROM 130 implements a memory initialization procedure. The initialization procedure begins when microprocessor 110, under the control of BIOS 130, accesses the SPD device at DIMM 150 through the I2C bus to determine memory system attributes such as memory speed, size, and the like, followed by initializing two mode registers, MR and EMR included at each of memory devices 152, 154, and 156. DDR1 SDRAM controller 116 initializes and subsequently accesses DIMM 150 via memory interface 140. SDRAM controller 116 issues MODE REGISTER SET commands to store appropriate data into MR and EMR. Once the initialization procedure is complete, microprocessor 110 can access DIMM 150 by performing read and write commands Processors and memory systems, such as microprocessor 110 and DIMM 150, are often subcomponents of electronic devices such as consumer appliances or industrial controllers. The processor subcomponent can be referred to as an embedded processor. The electronic device can have a long production lifetime, and can be manufactured and sold for many years. Throughout the production lifetime, the manufacturer of the electronic device must be ensured of continued and economical access to the subcomponents required to implement the electronic device. Due to the quick evolution of memory standards, manufacturers of electronic devices can experience particular difficulty procuring memory devices from a previous memory standard generation after a new memory standard becomes popular. For example, an electronic device that was designed to use DDR1 memory devices may well remain marketable even though the DDR1 memory devices may have become unavailable or prohibitively expensive. In such a case, the manufacturer of the electronic device would traditionally require the memory controller on the microprocessor to be re-designed to support the newer memory standard, such as DDR2. Alternatively, the manufacturer must estimate and procure adequate quantities of DDR1 devices, while such devices remain available, to ensure a supply of memory devices throughout the manufacturing lifetime of the electronic device.

Moreover, a microprocessor, such as microprocessor 110 that include DDR1 SDRAM controller 116, is typically designed and fabricated as a monolithic integrated circuit on a single silicon substrate. Modifying the design of microprocessor 110, such as to update DDR1 SDRAM controller 116 to support a new memory standard, such as DDR2, can be very expensive. In addition to engineering time and resources, new fabrication photo-masks, production test software and hardware development, and design qualification procedures are required to bring a modified microprocessor design to market. Furthermore, the original engineering team that is familiar with the microprocessor design may no longer be available to make complex revisions to a legacy integrated circuit product.

A memory system and methods are disclosed herein that alters an operation of a memory system in response to a control signal received from an interface, and based upon an indication of a type of memory device included at the memory system. For example, a processor that supports the access of DDR1 memory devices, such as microprocessor 110, can access a memory system that includes DDR2 memory devices without re-designing the processor.

Figure 2:
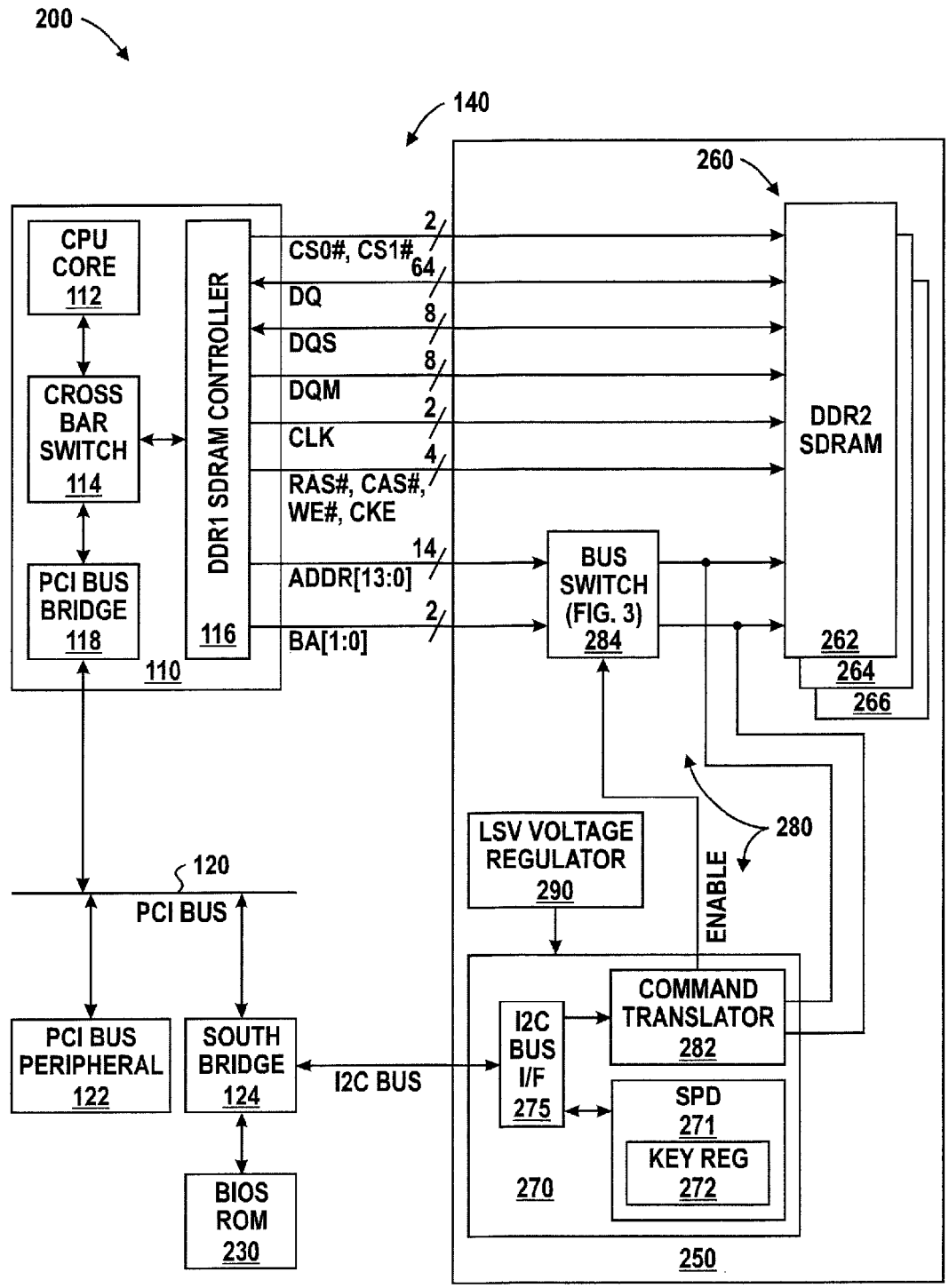
FIG. 2 illustrates in block diagram form a data processing system in accordance with the present invention.

FIG. 2 illustrates in block diagram form a data processing system 200 according to the present invention. Data processing system 200 generally includes microprocessor 110, PCI BUS 120, PCI bus peripheral 122, south bridge 124, and a memory interface 140, as described above. However, data processing system 200 also includes a modified BIOS ROM 230 and a DDR2 DIMM 250. DIMM 250 is a memory system that generally includes DDR2 memories 260, a complex programmable logic device (CLPD) 270, a bus switch 284, and a voltage regulator 290. CLPD 270 further includes an I2C bus interface 275, a command translator 282, and a SPD device 271 that further includes a key register 272. CPLD 270 and bus switch 284 together provide an override circuit 280. Memories 260 further includes a set of DDR2 memory devices including representative DDR2 memory devices 262, 264, and 266.

Memory interface 140 is the same as in FIG. 1 but is shown in greater detail here, in which it conducts individual signals labeled "CS0#" and "CS1#", "DQ", "DQS", "DQM", "CLK", "RAS#", "CAS#", "WE#", "CKE", "ADDR", and "BA."

DDR2 memory devices 262, 264, and 266 each have a two-bit input terminal to receive chip select signals CS0# and CS1#, a 64-bit input/output terminal to receive data signal DQ, an eight-bit input/output terminal to receive data strobe signal DQS, an eight-bit input terminal to receive data mask signal DQM, a two-bit input terminal to receive a clock signal CLK, and a four-bit input terminal to receive row address strobe signal RAS#, column address strobe signal CAS#, write enable signal WE#, and clock enable signal CKE, all signals conducted by memory interface 140. Each of DDR2 memory devices 262, 264, and 266 also has a fourteen-bit input terminal to receive an address signal, and a two-bit input terminal to receive a bank address signal. Bus switch 284 has a first input terminal to receive a fourteen-bit address signal ADDR[13:0], and a second input terminal to receive a two-bit bank address signal BA[1:0], both signals conducted by memory interface 140. Bus switch 284 also has a third input terminal, a first output terminal to provide the fourteen-bit address signal to DDR2 memory devices 262, 264, and 266, and a second output terminal to provide the two-bit bank address to memory devices 262, 264, and 266.

Voltage regulator 290 has an output to provide a 1.5 V voltage reference signal to CLPD 270. I2C bus interface 275 has an input/output terminal connected to the I2C bus to exchange information with south bridge 124, an output, and a bidirectional interface to SPD device 271. Command translator 282 has an input connected to the output of I2C bus interface 275, a first output connected to the third input of bus switch 284 to provide a signal labeled "ENABLE", a second output to also provide the fourteen-bit address signal to DDR2 memory devices 262, 264, and 266, and a third output to also provide the two-bit bank address to memory devices 262, 264, and 266.

The operation of microprocessor 110, PCI BUS 120, PCI bus peripheral 122, south bridge 124, and BIOS ROM 230 is described with reference to FIG. 1. The initialization procedure implemented by instructions stored at BIOS ROM 230 determines what type of DDR memories are incorporated at DIMM 250, and performs a memory initialization procedure appropriate for that type of memory. When power or a reset signal is applied to data processing system 200, microprocessor 110 begins accessing instructions stored at BIOS ROM 230. Before microprocessor 110 can access DIMM 250, DIMM 250 is initialized as specified by the appropriate JEDEC standard. The initialization procedure begins when microprocessor 110, under the control of BIOS 230, accesses key register 272 of SPD device 271 at CPLD 270. A particular data value stored at key register 272 provides an indicator to microprocessor 110 that identifies DIMM 250 as a memory system incorporating DDR2 type memories 260. SPD device 271 is configured to indicate the presence of DDR2 type memories by setting a previously unused and reserved SPD register bit location (byte two, bit seven) to a value of one. The BIOS also acquires other memory system attributes such as memory speed, size, and the like, from SPD device 271. The BIOS stored at BIOS ROM 230 is capable of initializing memory systems that include either DDR1 or DDR2 memory devices.

In order to initialize DDR2 memories 260, appropriate data values must be stored in four mode registers known as MR, EMR, EMR2, and EMR3 included at each of memories 262, 264, and 266. Microprocessor 110, and DDR1 SDRAM controller 116 in particular, is designed to initialize the mode registers included at DDR1 memory devices, but since it was designed for DDR1 memory devices, cannot directly initialize the additional DDR2 mode registers EMR2 and EMR3. However, the BIOS controls override circuit 280 to alter the operation of DIMM 250 such that microprocessor 110 and DDR1 SDRAM controller 116 can properly initialize DDR2 memories 260. Override circuit 280 intercepts values supplied by SDRAM controller 116 and instead provides override values to memories 260. The override values are provided to CPLD 270 by microprocessor 110 via the I2C interface bus. The override values include bank address information used to select a specific mode register, and mode register values to load into the selected mode register.

To perform a MODE REGISTER SET command, DDR1 SDRAM controller 116 activates selected one of signals CS0#/CS1#, RAS#, CAS#, and WE# as specified by the JEDEC DDR standard. In response to a MODE REGISTER SET command, a data value present at the fourteen-bit address input at each of memory devices 262, 264, and 266 is loaded into a mode register of each memory device. The particular mode register that is loaded is specified by a value present at the two-bit bank address input at each of memory devices 262, 264, and 266. In the particular embodiment illustrated, command translator 282 is a control circuit that receives a control signal from microprocessor 110 via the I2C bus interface, the control signal indicating that a MODE REGISTER SET command is forthcoming. In response to the control signal, command translator 282 can activate or deactivate signal ENABLE and thereby select which of either of bus switch 284, or command translator 282, is to provide address and data information to memories 260. During the memory initialization procedure, command translator 282 will provide this information to memories 260. After the memory initialization procedure is complete, DDR1 SDRAM controller 116 will provide this information to memories 260 via bus switch 284.

Figure 3:
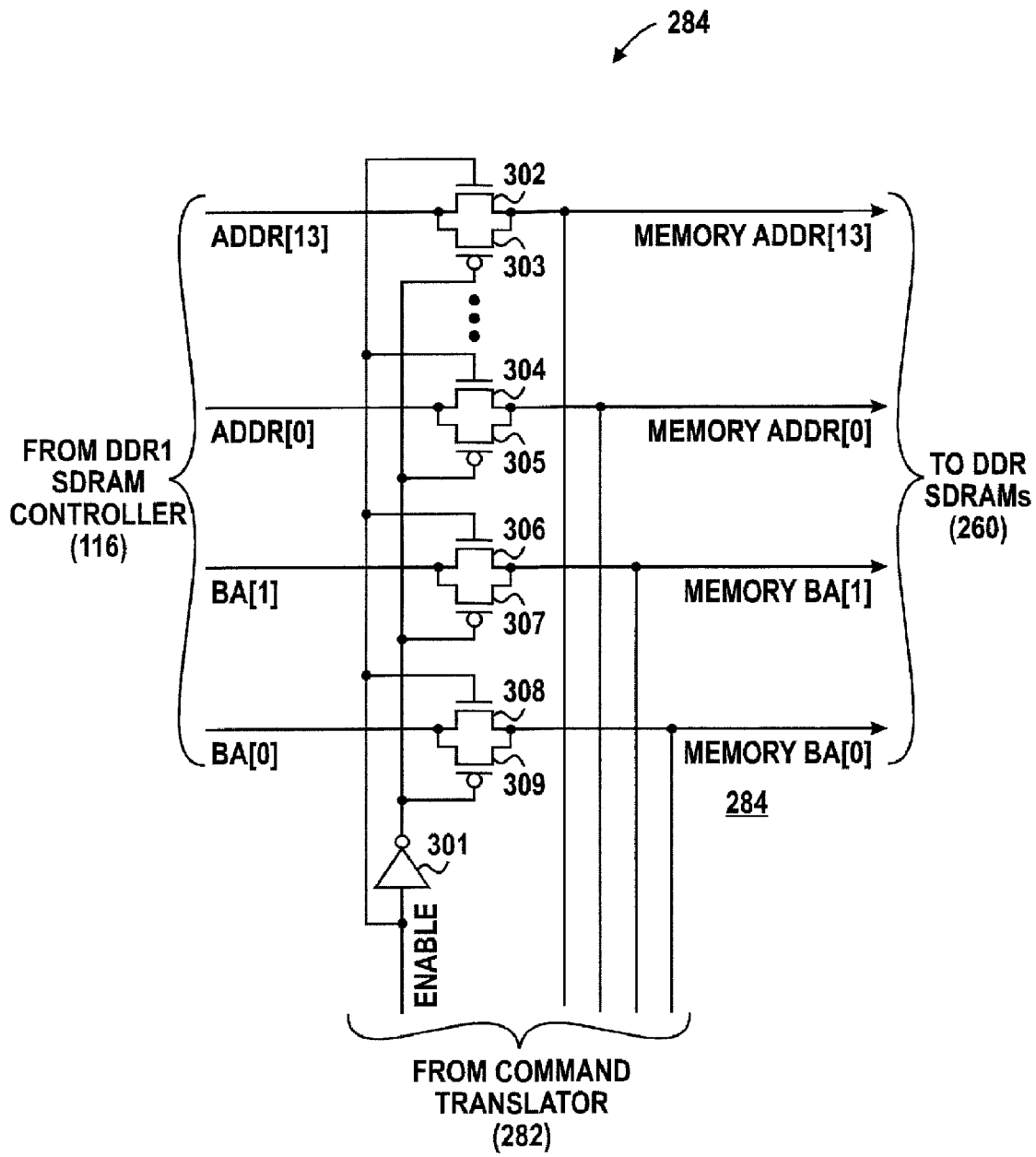
FIG. 3 illustrates in partial schematic and partial logic diagram form the bus switch of FIG. 2.

FIG. 3 illustrates in partial schematic and partial logic diagram form bus switch 284 of FIG. 2. Bus switch 284 includes n-type metal oxide semiconductor (NMOS) transistors 302, 304, 306, and 308, p-type metal oxide semiconductor (PMOS) transistors 303, 305, 307, and 309, and an inverter 301. Inverter 301 has an input to receive signal ENABLE, and an output. Each of transistors 302 and 303 has a first drain/source (D/S) terminal to receive signal ADDR[13] and a second D/S terminal to provide signal memory address 13. Each of transistors 304 and 305 has a first drain/source (D/S) terminal to receive signal ADDR[0] and a second D/S terminal to provide signal memory address[0]. Each of transistors 306 and 307 has a first drain/source (D/S) terminal to receive signal BA[1] and a second D/S terminal to provide a memory BA[1] signal. Transistors 308 and 309 each has a first drain/source (D/S) terminal to receive signal BA[0] and a second D/S terminal to provide a memory BA[0] signal. NMOS transistors 302, 304, 306, and 308 each has a gate to receive signal ENABLE, and PMOS transistors 303, 305, 307, and 309 each has a gate connected to the output of inverter 301. Transistors corresponding to address signals ADDR[12-1] are omitted from FIG. 3 for clarity.

During the memory initialization procedure, command translator 282, under BIOS control, sets signal ENABLE to a logic-low value, and transistors 302-309 are thus configured to be in an open circuit state. During this time, command translator 282 can provide mode register select and data information. After the initialization procedure has completed, command translator 282 sets signal ENABLE to a logic-high value, and each of transistors 302-309 are thus configured to conduct a signal present on their first D/S terminal to their corresponding second D/S terminal. Thus, signals provided by DDR1 SDRAM controller 116 are conducted through bus switch 284, and supplied to memories 260. Bus switch 284 is implemented using complementary MOS (CMOS) transmission gates, and signals conducted by bus switch 284 are not substantially delayed and the integrity of the signals is not substantially degraded. Bus switch 284 can be implemented using other circuit techniques that provide a desired minimum propagation delay. This permits microprocessor 110 to access DDR2 memories 260 at substantially the same speed that it can access DDR1 type memory devices.

Figure 4:
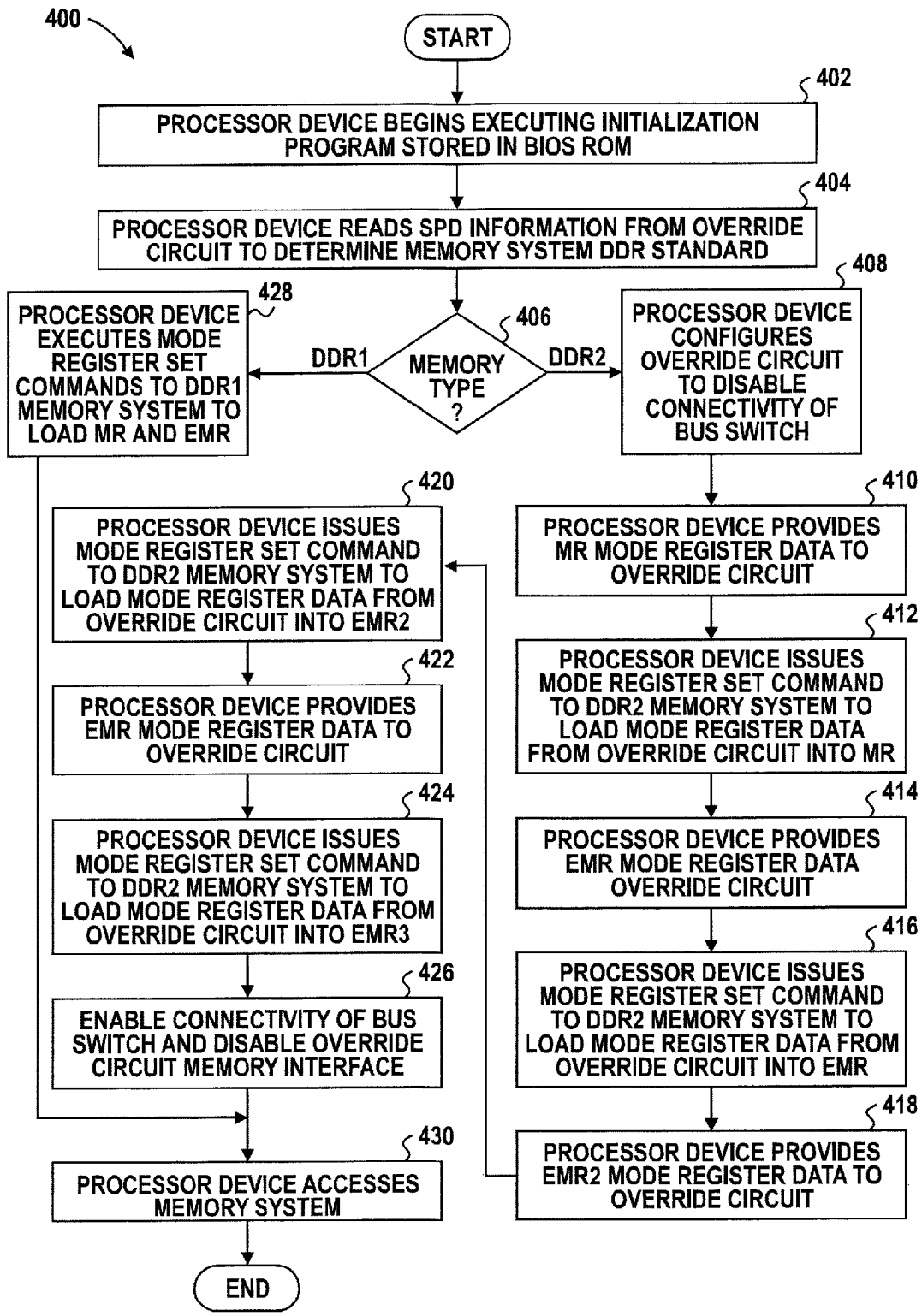
FIG. 4 illustrates a flow diagram of a memory system initialization sequence for use with the data processing system of FIG. 2.

FIG. 4 illustrates a flow diagram 400 of a memory system initialization sequence that can be performed by data processing system 200 at FIG. 2. At block 402, microprocessor 110 begins executing an initialization program stored in BIOS ROM 230. At block 404, microprocessor 110 reads SPD information from override circuit 280, via the I2C bus, to determine whether DIMM 250 includes DDR1 or DDR2 type memory devices. Decision block 406 directs the procedure to block 408 if DIMM 250 includes DDR2 memory devices, and to block 428 if DIMM 250 includes DDR1 memory devices. At block 408, having determined that DIMM 250 includes DDR2 memory devices, processor 110, based on information stored in BIOS ROM 230, configures override circuit 280 to disable connectivity of bus switch 284, and to enable command translator 282 to instead drive memories 260.

At block 410, microprocessor 110 provides override circuit 280 with the particular data value specified for mode register MR, and this value is provided to the fourteen-bit address input of each of memory devices 260, 262, and 264 by command translator 282. At block 412, microprocessor 110 issues a MODE REGISTER SET command to DDR2 DIMM 250 to load the mode register data from override circuit 280 into mode register MR. Microprocessor 110 is performing a MODE REGISTER SET command, appropriately configuring signals CS0#/CS1#, RAS#, CAS#, and WE# and CLK, but the mode register address and data information provided by DDR1 SDRAM controller 116 is not communicated to memory devices 260 by bus switch 284. Instead, address and data information is provided by command translator 282.

At block 414, microprocessor 110 provides override circuit 280 with the particular data value specified for mode register EMR, and this value is provided to the fourteen-bit address input of each of memory devices 260, 262, and 264 by command translator 282. At block 416, microprocessor 110 performs a MODE REGISTER SET command to DDR2 DIMM 250 to load the mode register data from override circuit 280 into mode register EMR.

At block 418, microprocessor 110 provides override circuit 280 with the particular data value specified for mode register EMR2, and this value is provided to the fourteen-bit address input of each of memory devices 260, 262, and 264 by command translator 282. At block 420, microprocessor 110 issues a MODE REGISTER SET command to DDR2 DIMM 250 to load the mode register data from override circuit 280 into mode register EMR2.

At block 422, microprocessor 110 provides override circuit 280 with the particular data value specified for mode register EMR3, and this value is provided to the fourteen-bit address input of each of memory devices 260, 262, and 264 by command translator 282. At block 424, microprocessor 110 issues a MODE REGISTER SET command to DDR2 DIMM 250 to load the mode register data from override circuit 280 into mode register EMR3.

Having completed loading mode registers MR, EMR, EMR2, and EMR3, processor 110 provides a control signal to command translator 282, instructing command translator 282 to re-enable connectivity of bus switch 284, and to disable command translator 426 memory interface drivers. Thus, the fourteen-bit address input and the two-bit bank address input of memory devices 260, 262, and 264 are provided by DDR1 SDRAM controller 116 instead of command translator 282. At block 430, initialization of memories 260 is complete, and DDR1 SDRAM controller 116 at microprocessor 110 and can perform memory accesses with DIMM 250.

FIG. 5 illustrates JEDEC standard mode register definitions 500 for DDR1 and DDR2 memory devices in a table format. During the memory initialization procedure, microprocessor 110 determines if DIMM 250 includes DDR1 or DDR2 memory devices. If DDR1 memory devices are detected, as indicated by a value stored at a register bit location at the key register of the SPD device, DDR1 SDRAM controller 116 uses MODE REGISTER SET commands to initialize mode registers MR and EMR as specified at table 510. If DDR2 memory devices are detected, override circuit 280 alters the operation of DIMM 250 in response to signals received from the interface of data processing system 200, and DDR1 SDRAM controller 116 uses MODE REGISTER SET commands, along with override circuit 280, to initialize mode registers MR, EMR, EMR2 and EMR3 as specified at table 520.

An override circuit, such as override circuit 280, intercepts and alters data values provided by a microprocessor as illustrated, but may alter the operation of a memory system, such as DIMM 250, in other ways. For example, an override circuit can receive control signals that correspond to memory commands that comply with one memory standard, and provide a translation of the memory commands to comply with another memory standard. Memory commands used to access, initialize, or otherwise configure a memory device can be received by an override circuit, and these commands can be converted into appropriate signals that are compliant with the electrical, timing, and functional protocol of another type of memory device. An indicator, such as a register data or signal value can identify the type of memory device present in the memory system and reconfigure the memory system to support the indicated memory type.

Note that override circuit 280, voltage regulator 290, and memories 260 can be incorporated into a DIMM or SO-DIMM, or can be physically organized in another manner. A manufacturer of an electronic device may prefer to use a custom memory module, such as DIMM 250 to avoid re-designing the main circuit board. In so doing, the manufacturer can substitute the custom memory modules containing DDR2 memory devices, include a revised initialization procedure at BIOS ROM 230, adjust power supply voltages if appropriate, and no further design modifications will be required. Alternatively, the manufacturer of an electronic device may prefer to re-design the main circuit board while using standard off-the-shelf DIMMs. Such an arrangement may be preferable if the main circuit board is already being re-designed. For example, override circuit 280 and voltage regulator 290 can be added to the main circuit board to allow it to use unmodified DDR2 DIMMs.

While the use of CPLD device technology is illustrated, another device technology such as PLD, FPGA, or discrete components can be used to implement all or a portion of override circuit 280 or of memory system 250.

Bridging from one memory interface standard to another standard can include a corresponding change in operating voltage of the memory devices. Voltage regulator 290 is included in DIMM 250 to illustrate a specific example of how a voltage regulator can be used to facilitate the use of devices with disparate operating voltage specifications. In the illustrated example, CPLD device 270 is designed to operate with a supply voltage of 1.5 volts, while the remainder of data processing system 200 operates at a 1.8 volt supply voltage potential. Power supply voltages may be configured by changing a resistor value, or a device may be designed to allow the voltages to be dynamically changed using a general purpose I/O (GPIO) and suitable circuitry. Skilled artisans will appreciate that specific supply voltage specifications can be supported with suitable partitioning of supply voltage domains, and by incorporating one or more voltage regulators to provide power to each domain. A level shifter circuit can be added to adjust the voltage level of a signal that passes from one voltage domain to another, if needed. For example, level shifters and a voltage regulator can be used by a DDR2 to DDR3 bridge circuit to supply the DDR3 memory devices with signals and power supply voltage at a different potential than used by other portions of an electronic device.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A memory system, comprising:
 a plurality of semiconductor memory devices coupled to an interface;
 an indicator for indicating a type of said plurality of memory devices is a first type; and
 an override circuit having a first terminal coupled to said interface, and a second terminal coupled to said plurality of memory devices;
 wherein during initialization of said memory system, if said indicator indicates said plurality of memory devices is said first type, said override circuit transfers at least one signal received at said interface to a mode register at said memory system, and if said indicator indicates said plurality of memory devices is not said first type, said override circuit intercepts said at least one signal and provides at least one override value to said mode register.

2. The memory system of claim 1, wherein said plurality of memory devices includes a plurality of second generation double data rate (DDR2) memory devices and said indicator indicates that said plurality of DDR2 memory devices are being bridged to a DDR1 memory controller.

3. The memory system of claim 1, wherein said indicator comprises at least one bit of a serial presence detect (SPD) register.

4. The memory system of claim 1, wherein said override circuit comprises:
a control circuit having an input for receiving a control signal responsive to said indicator, and an output; and
a bus switch having an input coupled to said interface, an output coupled to said plurality of memory devices, and a control input coupled to said output of said control circuit.

5. The memory system of claim 4, wherein said bus switch is responsive to a first state of said output of said control circuit to enable said control circuit to provide said at least one override value to said output of said bus switch.

6. The memory system of claim 4, wherein said control circuit is implemented using a programmable logic device (PLD).

7. The memory system of claim 4, wherein said bus switch includes a plurality of pass transistors each having a first current electrode coupled to a corresponding bit of said interface, a second current electrode coupled to each of said plurality of memory devices, and a control electrode coupled to said output of said control circuit.

8. A double data rate (DDR) memory module, comprising:
a plurality of DDR memory devices coupled to an interface;
a register for storing at least one bit that indicates a type of said plurality of DDR memory devices is a first type; and
an override circuit having a first terminal coupled to said interface, and a second terminal coupled to said plurality of said DDR memory devices;
wherein during initialization of said memory module, if said indicator indicates said plurality of memory devices is said first type, said override circuit transfers at least one signal received at said interface to a mode register at said memory module, and if said indicator indicates said plurality of memory devices is not said first type, said override circuit intercepts said at least one signal and provides at least one override value to said mode register.

9. The DDR memory module of claim 8, wherein said plurality of DDR memory devices comprises a plurality of second generation DDR (DDR2) memory devices.

10. The memory module of claim 9, wherein said at least one bit indicates that said plurality of DDR2 memory devices are being bridged to a first generation double data rate (DDR1) memory controller.

11. The DDR memory module of claim 8, wherein said register is part of a serial presence detect (SPD) electrically erasable programmable read only memory (EEPROM).

12. The DDR memory module of claim 8, wherein said override circuit comprises:
a control circuit having an input for receiving a control signal responsive to said at least one bit, and an output; and
a bus switch having a first terminal coupled to said interface, a second terminal coupled to said plurality of DDR memory devices, and a control input coupled to said output of said control circuit.

13. The DDR memory module of claim 12, wherein said control circuit and said SPD EEPROM are together implemented using a complex programmable logic device (CPLD).

14. The DDR memory module of claim 13, wherein said bus switch is responsive to a first state of said output of said control circuit to enable said control circuit to provide said at least one override value to said second terminal of said bus switch.

15. The DDR memory module of claim 13, wherein said bus switch includes a plurality of pass transistors each having a first current electrode coupled to a corresponding bit of said interface, a second current electrode coupled to each of said plurality of memory devices, and a control electrode coupled to said output of said control circuit.

16. A system comprising:
a data processor including a memory controller adapted to interface to a memory of a predetermined type;
a basic input/output system (BIOS) memory coupled to said data processor;
a plurality of semiconductor memory devices;
a register for storing at least one bit that selectively indicates that said plurality of memory devices are of a different type than said predetermined type; and
an override circuit having an input coupled to said memory controller, and an output coupled to said plurality of said memory devices,
wherein said BIOS memory stores a plurality of instructions that, responsive to said at least one bit, cause said data processor to activate said override circuit to transfer at least one signal received at said input of said override circuit to a mode register if said memory is said predetermined type, and to intercept said at least one signal and provide at least one override value to said mode register if said memory is different than said predetermined type.

17. The system of claim 16, wherein said plurality of memory devices include a plurality of second generation double data rate (DDR2) memory devices and said memory controller comprises a first generation double data rate (DDR1) memory controller.

18. The system of claim 17, wherein said mode register is included at a first memory device of said plurality of memory devices.

19. The system of claim 16, wherein said override circuit comprises:
a control circuit having an input for receiving a control signal responsive to said at least one bit, and a first output for providing an enable signal; and
a bus switch having a first terminal coupled to said memory controller, a second terminal coupled to said plurality of memory devices, and a control input coupled to said first output of said control circuit.

20. The system of claim 19, wherein said control circuit further has a second output coupled to said second terminal of said bus switch.

* * * * *